(12) United States Patent
Uenishi

(10) Patent No.: US 6,849,921 B2
(45) Date of Patent: Feb. 1, 2005

(54) SEMICONDUCTOR DEVICE

(75) Inventor: Akio Uenishi, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 09/901,046

(22) Filed: Jul. 10, 2001

(65) Prior Publication Data

US 2002/0070424 A1 Jun. 13, 2002

(30) Foreign Application Priority Data

Dec. 12, 2000 (JP) ......................................... 2000-377581

(51) Int. Cl.⁷ ............................................................ H01L 29/00
(52) U.S. Cl. ..................... 257/536; 257/537; 257/538; 257/539; 257/540; 257/541; 257/542; 257/543
(58) Field of Search ................................ 257/154, 354, 257/358–360, 363, 379, 380, 536–543, 533; 438/309, 310, 331, 330, 382

(56) References Cited

U.S. PATENT DOCUMENTS

| | | | | |
|---|---|---|---|---|
| 8,302 A | * | 9/1851 | Singh et al. | 257/538 |
| 11,754 A | * | 10/1854 | Koike | 257/379 |
| 4,210,996 A | * | 7/1980 | Amemiya et al. | 257/538 |
| 5,252,844 A | * | 10/1993 | Takagi | 257/379 |
| 5,652,460 A | * | 7/1997 | Kalb et al. | 257/536 |
| 5,790,154 A | * | 8/1998 | Mitani et al. | 257/537 |
| 5,837,592 A | * | 11/1998 | Chang et al. | 438/382 |
| 6,083,785 A | * | 7/2000 | Segawa et al. | 438/382 |
| 6,118,139 A | * | 9/2000 | Yada | 257/348 |
| 6,194,775 B1 | * | 2/2001 | Usami | 257/536 |
| 6,320,241 B1 | * | 11/2001 | Okamoto | 257/536 |
| 6,365,956 B1 | * | 4/2002 | Nonaka | 257/537 |
| 6,376,881 B1 | * | 4/2002 | Nagaya | 257/355 |
| 6,411,155 B2 | * | 6/2002 | Pezzani | 327/531 |
| 6,590,272 B2 | * | 7/2003 | Patti | 257/536 |

FOREIGN PATENT DOCUMENTS

| | | | | |
|---|---|---|---|---|
| JP | 1-214048 | | 8/1989 | |
| JP | 2-82567 | | 3/1990 | |
| JP | 09232516 | * | 5/1997 | ...................... 27/4 |
| JP | 09-232516 | * | 5/1997 | ...................... 27/4 |
| JP | 9-232516 | | 9/1997 | |

* cited by examiner

*Primary Examiner*—Donghee Kang
*Assistant Examiner*—Quang Vu
(74) *Attorney, Agent, or Firm*—McDermott Will & Emery LLP

(57) ABSTRACT

A semiconductor device includes: a semiconductor substrate; a first insulating film formed on the semiconductor substrate; a polysilicon resistor film formed on the first insulating film; a second insulating film formed on the resistor film; a high heat conductor film consisting of a highly heat-conducting material formed on the second insulating film; and a pair of terminal wirings formed on the second insulating film and connected to the resistor film, in which a thickness T3 of the second insulating film is thinner than a thickness T2 of the resistor film.

5 Claims, 4 Drawing Sheets

SEMICONDUCTOR DEVICE

BACKGROUND OF THE INVENTION

1. Field of the Invention

The present invention relates to a semiconductor device, and more particularly to a semiconductor device that comprises a resistor film consisting of polysilicon formed in an insulating film on a semiconductor substrate.

2. Background Art

FIG. 5 is a sectional view showing a schematic configuration of a conventional integrated circuit that comprises polysilicon resistors. In this drawing, reference numeral 1 is a silicon substrate, i.e. a semiconductor substrate; 2 is an insulating film consisting of a field oxide film or an interlayer insulating film formed on the silicon substrate 1, 3 is a resistor film consisting of polysilicon formed in the insulating film 2; 4A and 4B are terminal wirings of the resistor film 3 formed on the insulating film 2, and connected to the resistor film 3 through connecting portions 5A and 5B.

The integrated circuit comprising a conventional resistor film is constituted as described above, and heat generated in the resistor film 3 is dissipated into the silicon substrate 1 through the insulating film 2 underneath the resistor film 3, but the heat is not sufficiently transferred because the insulating film 2 underneath the resistor film 3 is as thick as about 0.5 μm, thereby raising a problem of low resistance to instantaneous surge electric power.

Specifically, as shown by curve a in FIG. 3 that indicates the result of simulation of the temperature rise of the resistor film 3 in the case where a step electric power of about 3 mW was consumed, a temperature rise per unit power consumption was as large as 2,200 deg./W, in 1 μs showing a large transient heat impedance.

Also, as shown by curve a in FIG. 4 that indicates the result of ESD (electrostatic discharge) simulation of discharge from a 200 pF capacitor, temperature rose rapidly in 700 ns after starting power supply to over 2,000 K, leading to thermal breakdown.

In recent years, since the resistor film 3 is becoming thinner accompanying the size reduction of transistors due to the advancement of micro machining technology, the resistance to surge power tends to further lower.

SUMMARY OF THE INVENTION

Therefore, an object of the present invention is to cope with such a problem, and to provide a semiconductor device that can improve a resistance to a surge power of integrated circuits or the like having resistor films.

According to one aspect of the present invention, a semiconductor device comprises a semiconductor substrate, a first insulating film formed on the semiconductor substrate, a polysilicon resistor film formed on the first insulating film, a second insulating film formed on the resistor film, a high heat conductor film consisting of a highly heat-conducting material formed on the second insulating film, and a pair of terminal wirings formed on the second insulating film and connected to the resistor film, wherein a thickness of the second insulating film is thinner than a thickness of the resistor film.

According to another aspect of the present invention, a semiconductor device comprises a semiconductor substrate, a first insulating film formed on the semiconductor substrate, a polysilicon resistor film formed on the first insulating film, a second insulating film formed on the resistor film, a high heat conductor film consisting of a highly heat-conducting material formed on the second insulating film, and a pair of terminal wirings formed on the second insulating film and connected to the resistor film, wherein a thickness of the high heat conductor film is thicker than a thickness of the resistor film.

According to the present invention, the resistance to instantaneous surge power of the semiconductor devices having resistor films can be improved.

Other and further objects, features and advantages of the invention will appear more fully from the following description.

DETAILED DESCRIPTION OF THE PREFERRED EMBODIMENTS

Embodiment 1

Figure 1:
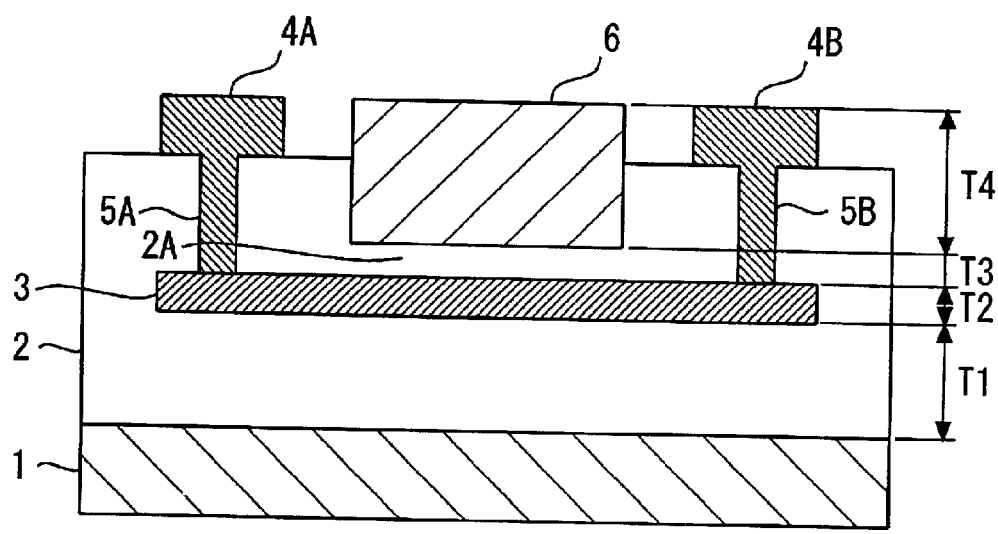
FIG. 1 is a sectional view showing a schematic constitution of Embodiment 1.

Embodiment 1 of the present invention will be described below referring to the drawings.

FIG. 1 is a sectional view showing a schematic constitution of Embodiment 1. In FIG. 1, reference numeral 1 is a silicon substrate, i.e. a semiconductor substrate; 2 is an insulating film consisting of a field oxide film or an interlayer insulating film formed on the silicon substrate 1; 3 is a resistor film consisting of polysilicon formed in the insulating film 2; 4A and 4B are terminal wirings of the resistor film 3 formed on the insulating film 2, and connected to the resistor film 3 through connecting portions 5A and 5B.

Reference numeral 6 denotes a high heat conductor film consisting of a high heat conductor material formed above the resistor film 3 through a thin insulating film 2A, and is made of aluminum (Al) or an alloy thereof.

T1 is a thickness of the insulating film 2 (silicon oxide film) provided underneath the resistor film 3, for example 0.5 μm. T2 is the thickness of the resistor film 3, for example 0.15 μm. T3 is a thickness of the insulating film 2A (silicon oxide film) between the resistor film 3 and the high heat conductor film 6. T4 is a thickness of the high heat conductor film 6. Specific values of T3 and T4 will be described later.

Embodiment 1 is constituted as described above. Thereby, since a heat path is produced from the resistor film 3 to the high heat conductor film 6 through the thin insulating film 2A over the resistor film 3, in addition to a path for dissipating heat into the silicon substrate 1 through the thin insulating film 2 underneath the resistor film 3, a heat capacity of the high heat conductor film 6 can temporarily absorb the heat generated in the resistor film 3 due to surge power until the heat is accumulated in the high heat conductor film 6, thus improving the resistance to the surge power.

Figure 2:
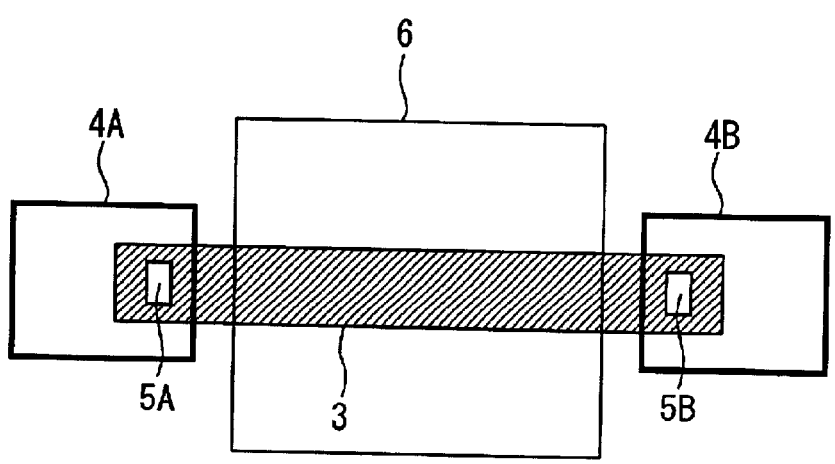
FIG. 2 is a top view showing a schematic constitution of modification of Embodiment 1.
Figure 3:
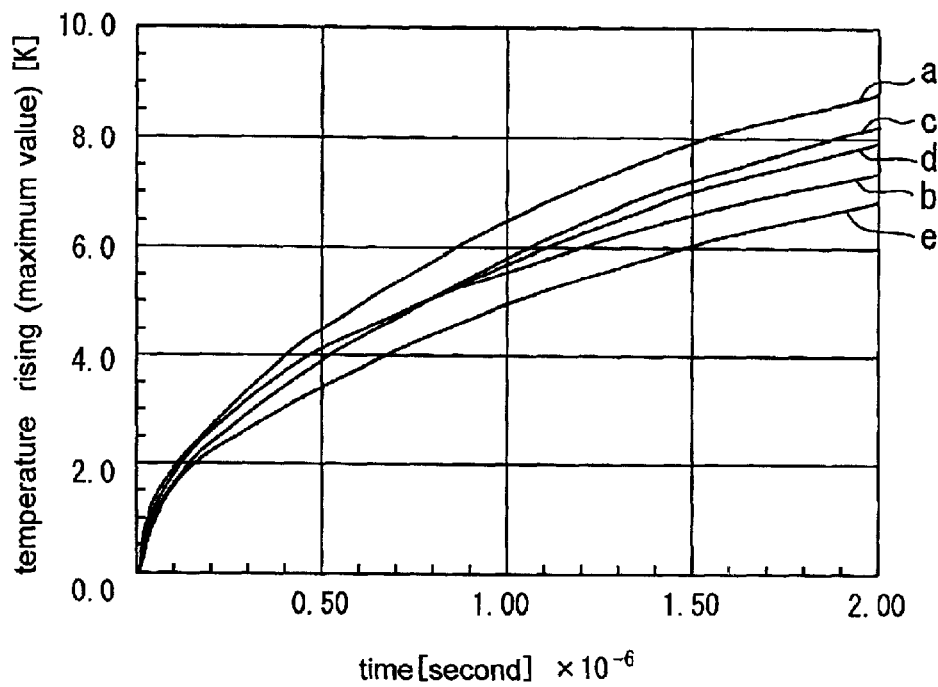
FIG. 3 is a graph of characteristic curves showing the results of a temperature rise simulation obtained to clarify the constitution of Embodiment 1 as well as to confirm the effect
Figure 4:
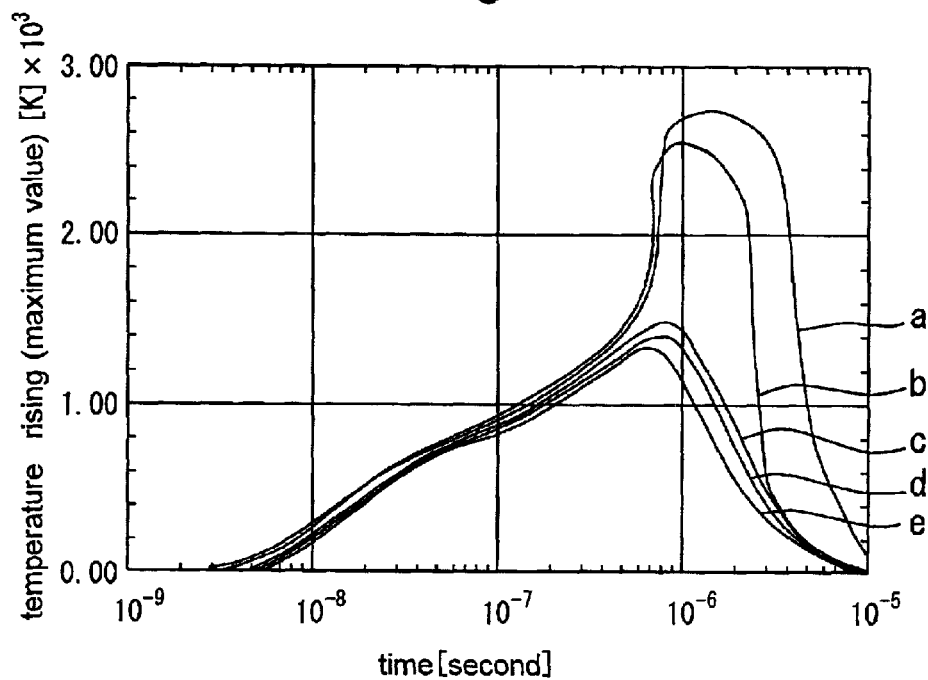
FIG. 4 is a graph of characteristic curves showing the results of an ESD simulation obtained to clarify the constitution of Embodiment 1 as well as to confirm the effect
Figure 5:
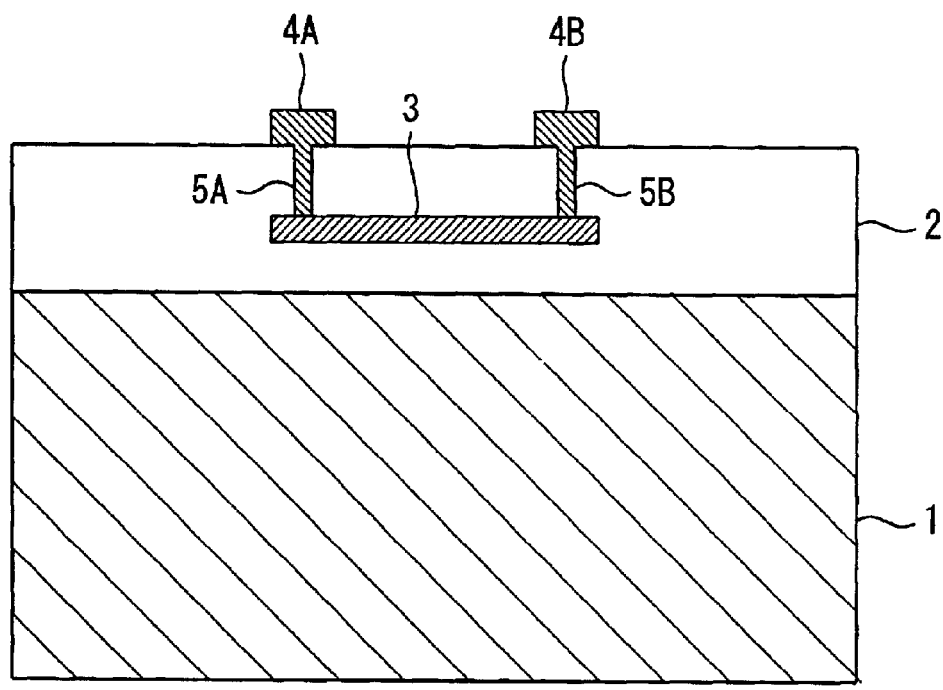
FIG. 5 is a sectional view showing a schematic configuration of a conventional integrated circuit that comprises polysilicon resistors.
Figure 6:
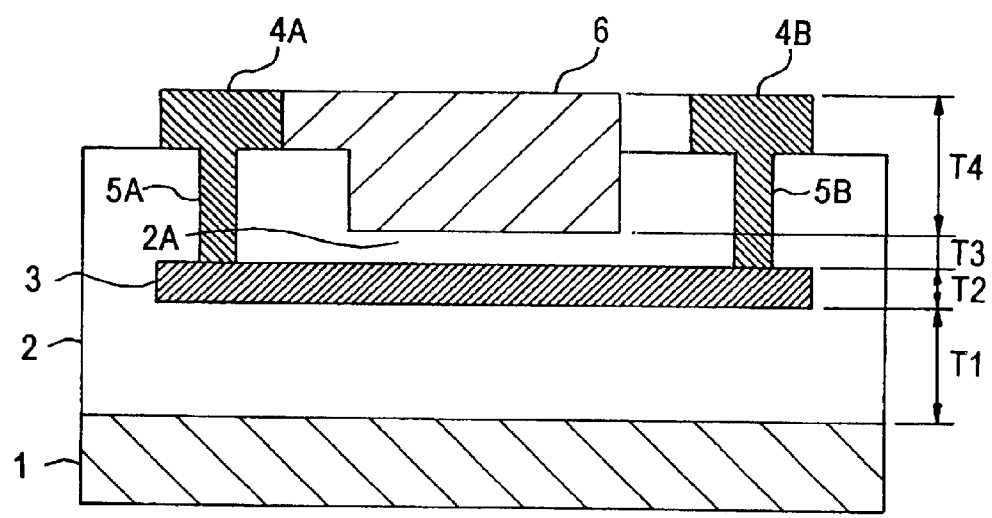
FIG. 6 is a sectional view showing a high heat conductor layer united with a terminal wiring.

In this case, since the pulse width of the surge current is usually about 0.2 $\mu$s, the heat generated in the resistor film 3 passes through the insulating film 2A in about the above-described time and reaches the high heat conductor film 6. Furthermore, in order to maintain the heat absorption by the high heat conductor film 6 thereafter, a thickness T3 of the insulating film 2A becomes an important factor.Similarly as an interlayer film used in general IC processes, when the thickness T3 of the insulating film 2A is, for example, 0.5 $\mu$m, the time for heat to pass is about 1 $\mu$s. Therefore, the thickness is too thick for a pulse width of the above-described surge current to expect sufficient effect.Also, since the heat transferred to the high heat conductor film 6 scarcely diffuses to a lateral direction because of the narrow pulse width of a surge current, a heat absorption must be supplemented by increase in thickness.FIGS. 3 and 4 are graphs of characteristic curves showing the results of a temperature rise simulation and an ESD simulation obtained to clarify the constitution of Embodiment 1 as well as to confirm the effect, and show characteristics of each of T3 and T4 when the thicknesses of T3 and T4 is set to various values in the structure shown in FIG. 1, for example, T1=0.5 $\mu$m and T2=0.15 $\mu$m. That is, in these characteristic diagrams, a curve b shows when T4=1 $\mu$m and T3=0.2 $\mu$m, a curve c shows when T4=0.2 $\mu$m and T3=0.1 $\mu$m, a curve d shows when T4=0.45 $\mu$m and T3=0.1 $\mu$m, and a curve e shows when T4=1 $\mu$m and T3=0.1 $\mu$m.As seen in the curves c, d, and e of FIG. 4, when the thickness T3 of the insulating film 2A on an upper surface of the resistor film is T3=0.1 $\mu$m, thinner than the thickness T2=0.15 $\mu$m of the resistor film 3, a peak temperature lowers to 1,400 K, then the permanent breakdown does not occur. However, as seen in the curve b, when the thickness T3=0.2 $\mu$m, thicker than the thickness of the resistor film 3, a temperature rises rapidly causing permanent breakdown, and it is seen that a resistance to surge power is low.For the thickness T4 of Al of the high heat conductor film 6, when T4=0.2 $\mu$m or more, thicker than the thickness of the resistor film 3, permanent breakdown does not occur, as seen in any of curve c (T4=0.2 $\mu$m), curve d (T4=0.45 $\mu$m), and curve e (T4=1 $\mu$m).When the curves c, d, and e are compared, the peak temperature of the curve d or curve e where the thickness T4 of Al is twice the thickness T2 of the resistor film 3 or more, 0.45 $\mu$m or 1 $\mu$m, respectively, is nearly 200 K lower than a peak temperature of the curve c, achieving larger effect. Furthermore, when transient heat impedance characteristics in the above-described cases are viewed from FIG. 3, an instantaneous temperature rise up to 0.4 $\mu$s is large in the curve b and the curve a (prior art) in FIG. 4, which lead to permanent breakdown, and it is seen that characteristics up to this time point are significantly related to the occurrence of ESD breakdown.From the above results, in Embodiment 1, it was concluded, to obtain the sufficient effect of absorbing surge power, that the thickness T3 of the insulating film 2A should be thinner than the thickness T2 of the resistor film 3, and the thickness T4 of the high heat conductor layer 6 should be thicker than T2, preferably twice T2 or more.Although the high heat conductor layer 6 is composed of Al or the alloys thereof, the materials are not limited to these, and the same effect can be expected from copper, poly-amorphous silicon, or the like. The same effect can also be expected from a multi-layer wiring structure in which a wiring layer is further provided on the high heat conductor layer 6 through an insulating film.Furthermore, heat capacity can further be increased by making the high heat conductor layer 6 wider than the resistor film 3, not only to cover the resistor film 3, as shown in FIG. 2.Also, when the high heat conductor layer 6 is used in common with terminal wiring 4A and 4B made of Al or the like, since the area of the high heat conductor layer 6 can be increased by using the high heat conductor layer 6 as a part of the ground/power wiring region or input/output pads, the resistance to surge power of not only an extremely short time such as ESD, but also a relatively long time of the millisecond order, can be improved. FIG. 6 illustrates the high heat conductor layer 6 united with one of the termiral wirings 4A.Since the semiconductor device according to the present invention is constituted as described above, the resistance to instantaneous surge power of the semiconductor devices having resistor films can be improved.The entire disclosure of a Japanese Patent Application No. 2000-377581, filed on Dec. 12, 2000 including specification, claims, drawings and summary, on which the Convention priority of the present application is based, are incorporated herein by reference in its entirety.

What is claimed is:1. A semiconductor device, comprising:

a semiconductor substrate;

a first insulating film formed on said semiconductor substrate;

a polysilicon resistor film formed on said first insulating film;

a second insulating film formed on said resistor film;

a pair of terminal wirings formed on said second insulating film and connected to said resistor film; and a high heat conductor film consisting of a highly heat-conducting material formed on said second insulating film, said high heat conductor film formed in a predetermined area including an area above said resistor film between said pair of terminal wirings, wherein a thickness of said high heat conductor film is thicker than a thickness of said resistor film, and said high heat conductor film is spaced apart from at least one of said pair of terminal wirings.2. The semiconductor device according to claim 1, wherein the thickness of said high heat conductor film is twice the thickness of said resistor film or thicker.3. A semiconductor device, comprising:

a semiconductor substrate;

a first insulating film formed on said semiconductor substrate;

a polysilicon resistor film formed on said first insulating film;

a second insulating film formed on said resistor film;

a high heat conductor film of a highly heat-conducting material formed on said second insulating film;

a pair of terminal wirings formed on said second insulating film and conducted to said resistor film;

wherein a thickness of said high heat conductor film is greater than a thickness of said resistor film, a width of said high heat conductor film is greater than a width of said resistor film and said high heat conductor film is formed in a predetermined area including an area above said resistor film between said pair of terminal wirings.4. The semiconductor device according to claim 1, wherein said high heat conductor film is united with one of said terminal wirings.5. A semiconductor device, comprising:

a semiconductor substrate;

a first insulating film formed on said semiconductor substrate;

a polysilicon resistor film formed on said first insulating film;

a second insulating film formed on said resistor film;

a pair of terminal wirings formed on said second insulating film and connected to said resistor film; and a high heat conductor film consisting of a highly heat-conducting material formed on said second insulating film, said high heat conductor film formed in a predetermined area including an area above said resistor film between said pair of terminal wirings, wherein a thickness of said second insulating film is thinner than a thickness of said resistor film, a thickness of said high heat conductor film is thicker than a thickness of said resistor film, and said high heat conductor film is spaced apart from at least one of said pair of terminal wirings.

* * * * *